(12) United States Patent
Zundel et al.

(10) Patent No.: US 7,875,560 B2
(45) Date of Patent: Jan. 25, 2011

(54) SEMICONDUCTOR HAVING OPTIMIZED INSULATION STRUCTURE AND PROCESS FOR PRODUCING THE SEMICONDUCTOR

(75) Inventors: Markus Zundel, Egmating (DE); Norbert Krischke, München (DE)

(73) Assignee: Infineon Technologies Austria AG, Villach (AT)

( * ) Notice: Subject to any disclaimer, the term of this patent is extended or adjusted under 35 U.S.C. 154(b) by 551 days.

(21) Appl. No.: 11/392,363

(22) Filed: Mar. 29, 2006

(65) Prior Publication Data

US 2007/0190739 A1   Aug. 16, 2007

(30) Foreign Application Priority Data

Feb. 15, 2006   (DE) .................. 10 2006 007 053

(51) Int. Cl.
    H01L 21/31    (2006.01)
    H01L 21/469   (2006.01)
(52) U.S. Cl. ................. 438/766; 257/E21.339
(58) Field of Classification Search ............ 438/766; 257/E21.339
    See application file for complete search history.

(56) References Cited

U.S. PATENT DOCUMENTS

| | | | | |
|---|---|---|---|---|
| 3,936,322 A | * | 2/1976 | Blum et al. ................... 438/45 |
| 4,968,636 A | * | 11/1990 | Sugawara ................... 438/423 |
| 4,997,786 A | * | 3/1991 | Kubota et al. ............... 438/480 |
| 5,344,787 A | * | 9/1994 | Nagalingam et al. ........ 438/298 |
| 5,629,217 A | * | 5/1997 | Miwa et al. .................. 438/480 |
| 5,885,904 A | * | 3/1999 | Mehta et al. ................. 438/758 |
| 5,904,575 A | * | 5/1999 | Ishida et al. ................. 438/770 |
| 5,981,318 A | * | 11/1999 | Blanchard ................... 438/162 |
| 5,994,190 A | * | 11/1999 | Hashimoto .................. 438/298 |
| 6,110,845 A | * | 8/2000 | Seguchi et al. .............. 438/795 |
| 6,127,242 A | * | 10/2000 | Batra et al. .................. 438/440 |
| 6,261,876 B1 | * | 7/2001 | Crowder et al. ............. 438/149 |
| 6,635,559 B2 | * | 10/2003 | Greenwald et al. .......... 438/604 |
| 7,041,575 B2 | * | 5/2006 | Forbes ........................ 438/450 |
| 7,115,463 B2 | * | 10/2006 | Sadana et al. ............... 438/218 |
| 2001/0034086 A1 | * | 10/2001 | Crowder et al. ............. 438/149 |
| 2003/0042501 A1 | * | 3/2003 | Greenwald et al. .......... 257/189 |
| 2003/0127692 A1 | * | 7/2003 | Kendall ....................... 257/356 |
| 2004/0082132 A1 | * | 4/2004 | Comard ....................... 438/296 |
| 2006/0006376 A1 | * | 1/2006 | Kendall et al. ................. 257/14 |
| 2006/0038206 A1 | | 2/2006 | Shimoyama et al. |
| 2006/0040476 A1 | * | 2/2006 | Sadana et al. ............... 438/479 |
| 2006/0115965 A1 | * | 6/2006 | Abraham ..................... 438/510 |
| 2006/0183330 A1 | * | 8/2006 | Abraham et al. ............ 438/689 |
| 2006/0276040 A1 | * | 12/2006 | Abraham ..................... 438/689 |
| 2007/0269957 A1 | * | 11/2007 | Cha et al. .................... 438/423 |
| 2008/0023795 A1 | * | 1/2008 | Yamazaki et al. ............ 257/592 |

FOREIGN PATENT DOCUMENTS

DE      102005038152 A1   3/2006

* cited by examiner

*Primary Examiner*—Matthew S Smith
*Assistant Examiner*—John M Parker
(74) *Attorney, Agent, or Firm*—Dicke, Billig & Czaja, PLLC

(57) ABSTRACT

A semiconductor having an optimized insulation structure which is simple and inexpensive to produce and can be made smaller than LOCOS insulation structures is disclosed. An implantation mask on a surface of a semiconductor substrate is used to implant elements into the semiconductor substrate, which elements, on thermal activation, form an insulation region together with the further elements of the semiconductor substrate. The thermal activation is effected by means of laser irradiation, during which the semiconductor substrate is briefly melted and then recrystallizes during the subsequent cooling, so that the implanted elements form the insulation region together with the further elements of the semiconductor substrate.

16 Claims, 5 Drawing Sheets

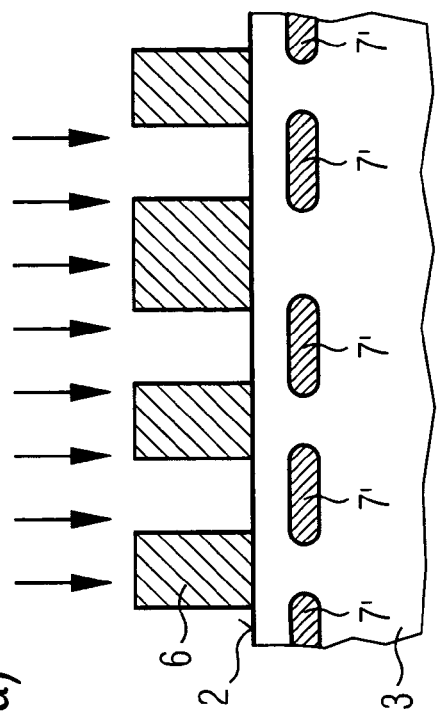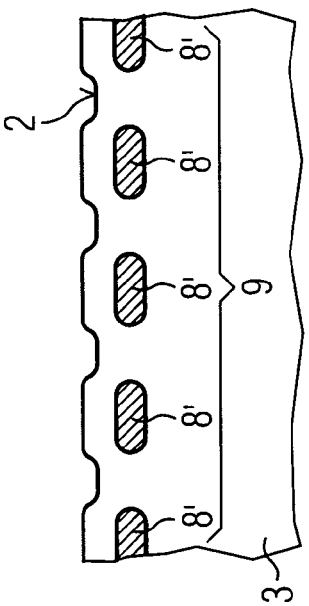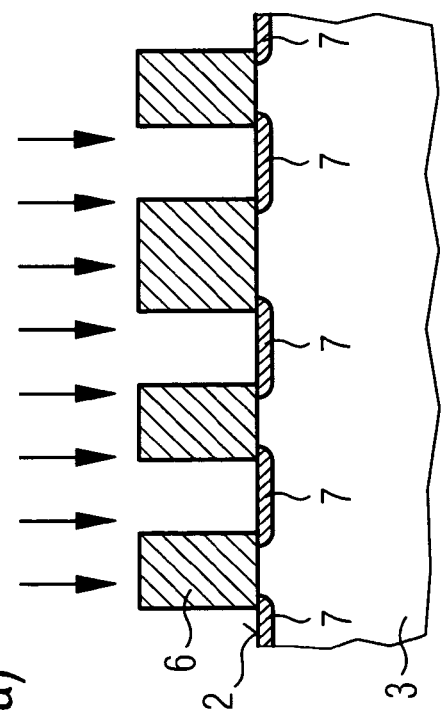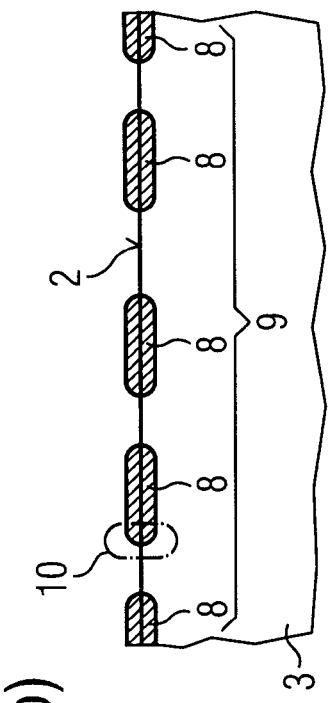

FIG 4
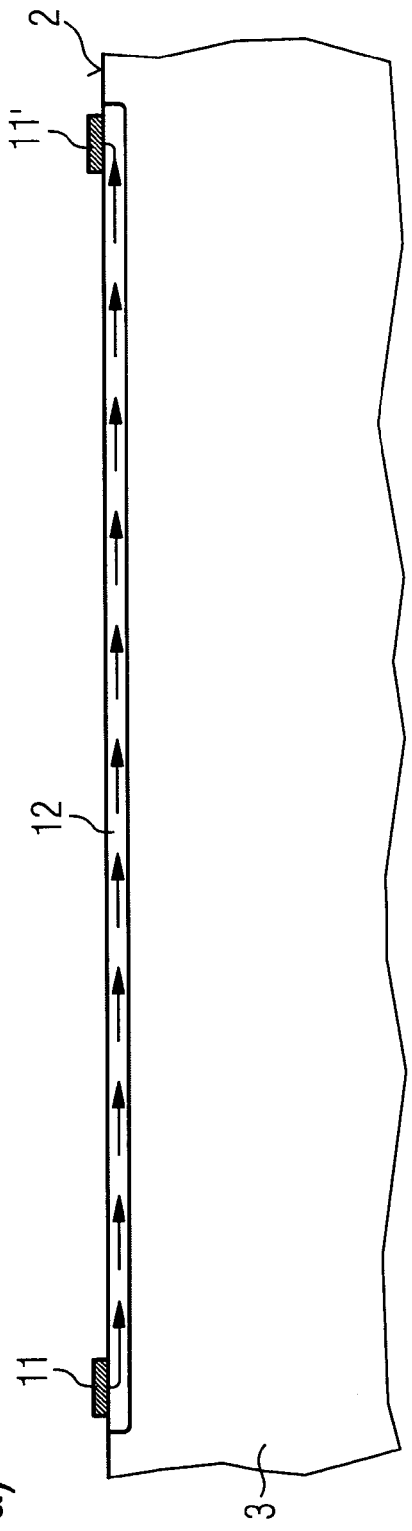
a)
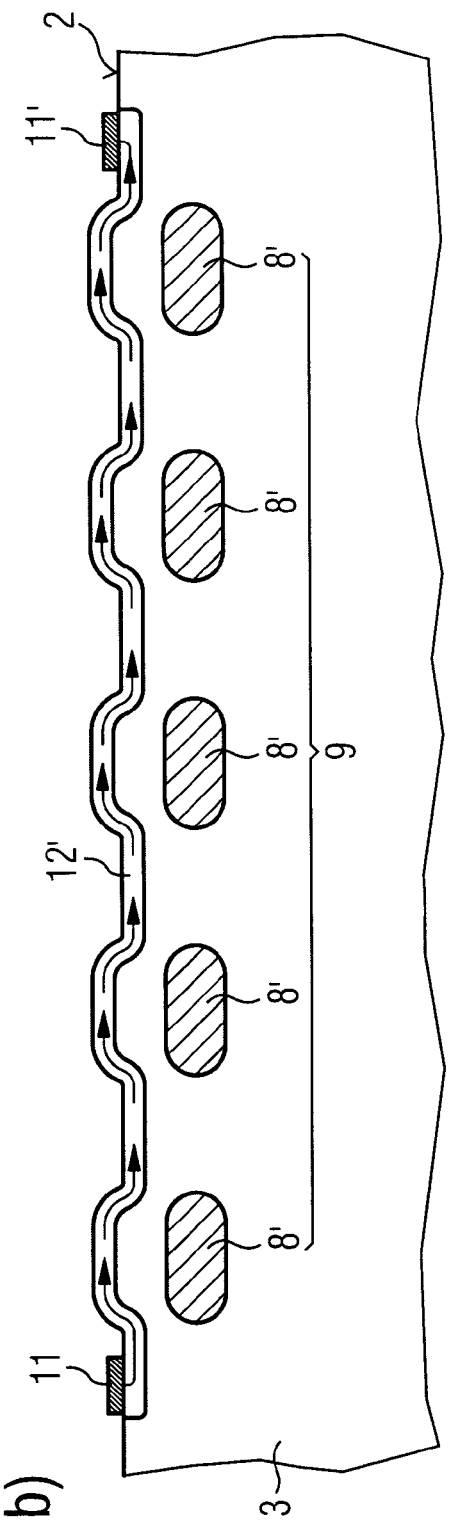
b)

FIG 5
a)
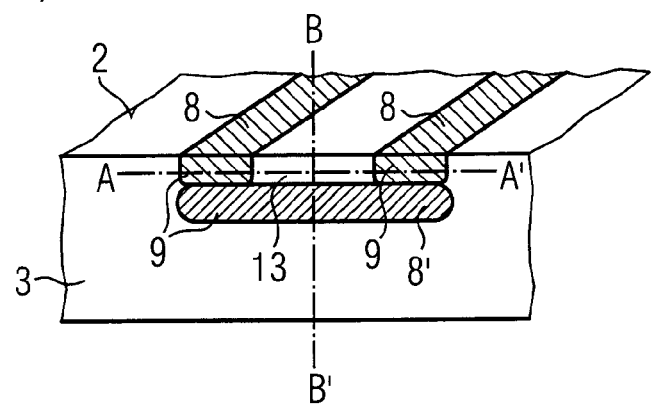
b)
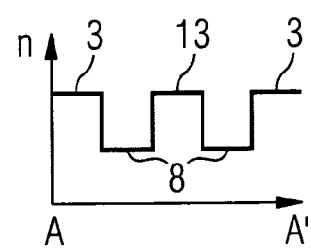
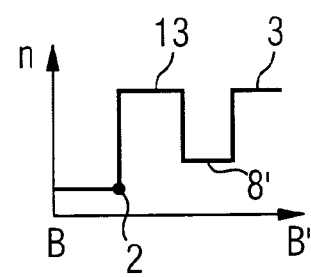
FIG 6
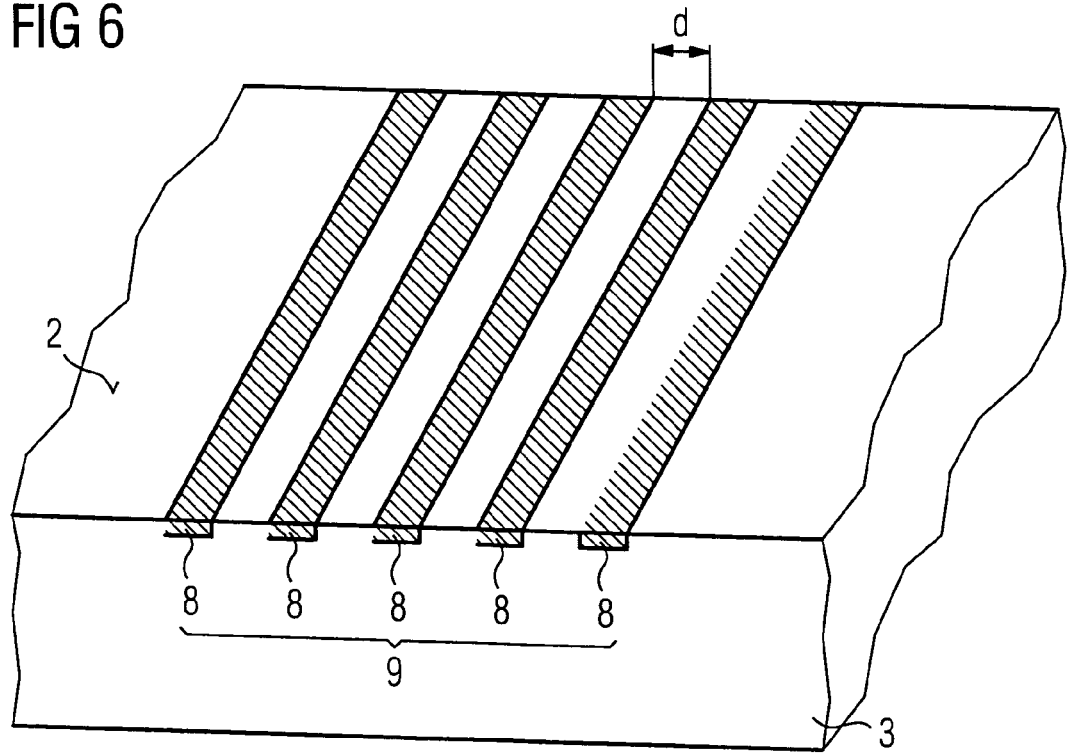

SEMICONDUCTOR HAVING OPTIMIZED INSULATION STRUCTURE AND PROCESS FOR PRODUCING THE SEMICONDUCTOR

CROSS-REFERENCE TO RELATED APPLICATIONS

This Utility Patent Application claims priority to German Patent Application No. DE 10 2006 007 053.4, filed on Feb. 15, 2006, which is incorporated herein by reference.

BACKGROUND

Reducing the size of semiconductor components is of crucial importance in the development of new generations of semiconductor technologies. By reducing the dimensions of the semiconductor components, it is possible to increase the integration density on a semiconductor chip and therefore to achieve a cost saving, which is an important development objective. However, insulation structures which provide an electrical insulation, for example between adjacent semiconductor components, in an ever smaller space are required in order to reduce the component dimensions.

The selective oxidation of silicon is an insulation process that is in widespread use in the field of silicon semiconductor technology. This is also referred to as LOCOS (LOCal Oxidation Of Silicon) and is used above all as suitable insulation between components.

A typical process sequence used to form LOCOS regions includes, for example, first of all growing a thermal oxide with a thickness of, for example, 50 nm on a silicon substrate, followed by subsequent production of a nitride layer with a thickness of, for example, 140 nm on the thermal oxide. The nitride layer on the thermal oxide can be patterned by means of a plasma etch. This uncovers the regions in which field oxide regions are to be formed during the subsequent oxidation. In the regions in which the nitride remains in place, the nitride acts as a barrier and prevents oxygen diffusion during the oxide growth. Since nitrogen-oxygen compounds also form on the nitride during the field oxidation, etching of the oxide is also required prior to the wet-chemical removal of the nitride mask, for example using phosphoric acid, but this involves undesirable thinning of the field oxide. On account of the lateral diffusion of the oxygen under the diffusion barrier nitride, the result is the "bird's beak" that is characteristic of a LOCOS structure. However, the dimensions of the bird's beak have to be taken into account in the design rules which are intended to ensure the process reliability and manufacturing suitability of a semiconductor technology, consequently resulting in relatively large fin and spacer regions. A fin with a typical lateral extent of 3.6 µm and a distance between adjacent LOCOS root points of 1.2 µm results for a LOCOS structure with a thickness of, for example, 600 nm. A reduction in the lateral dimensions of an insulation structure, for example in the case of a semiconductor technology with CMOS (Complementary Metal Oxide Semiconductor) and DMOS (Double Diffused Metal Oxide Semiconductor) components would have the effect of saving space during the formation of edge terminations, the separation between transistors, between highly doped n-type and p-type connection zones and between gate and drain regions.

In semiconductor technologies with features sizes in the range of 0.5 µm and below, what is known as shallow trench isolation (STI) constitutes another way of achieving higher integration densities of electrical insulation regions. A typical process sequence used to form a shallow trench isolation includes, for example, first of all anisotropically etching a trench into a semiconductor substrate, followed by thermal oxidation in order to oxidize out radiation damage. The trench is then filled, for example with the aid of a CVD oxide (CVD: chemical vapour deposition), e.g. with a HDPCVD oxide (high density plasma CVD oxide). The filling of the trench is followed by a planarization step, e.g. using CMP (Chemical Mechanical Polishing). Therefore, what remains is a trench which has been filled with oxide up to the surface of the semiconductor substrate. Shallow trench isolation can achieve smaller dimensions of the insulation structures compared to LOCOS insulation, but is associated with higher costs on account of the trench etch and the CMP.

For these and other reasons, there is a need for the present invention.

SUMMARY

The present invention provides for a semiconductor having optimized insulation structure and process for producing the semiconductor. In one embodiment, the process for producing an insulation structure in a semiconductor substrate includes providing the semiconductor substrate. An implantation mask is produced and patterned on a surface of the semiconductor substrate. Elements are implanted into at least one subregion of the semiconductor substrate, the implanted elements being selected in such a manner that on thermal activation they form an insulation region together with the further elements of the semiconductor substrate. The insulation structure is formed by irradiating the semiconductor substrate with laser radiation, so that the at least one subregion is melted and then recrystallizes as insulation region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates diagrammatic cross-sectional views during various process stages involved in the production of a semiconductor having an insulation structure according to one embodiment of the invention.

FIG. 3 illustrates various process stages involved in the production of a semiconductor insulation structure in accordance with a further embodiment of the invention.

FIG. 4 illustrates diagrammatic cross-sectional views of semiconductor substrates with current conduction channels in accordance with a further embodiment of the invention.

FIG. 5 illustrates a diagrammatic cross-sectional view of a semiconductor substrate with an insulation structure forming a waveguide region in accordance with a further embodiment of the invention.

FIG. 6 illustrates a diagrammatic view of a semiconductor substrate with strip-like insulation regions in accordance with a further embodiment of the invention.

DETAILED DESCRIPTION

Figure 1:
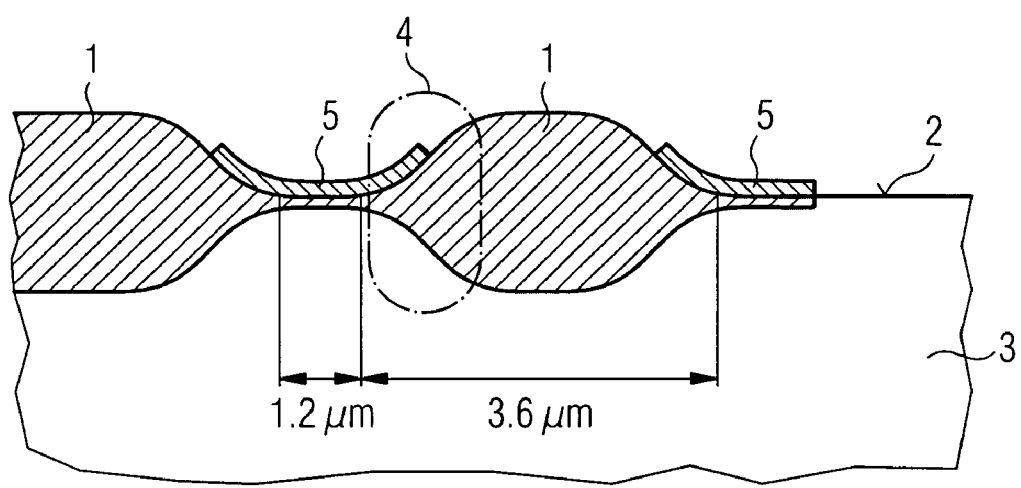
FIG. 1 illustrates a LOCOS insulation structure of a known type.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a process for producing an optimized insulation structure which is simple and inexpensive to realize and, moreover, allows insulation structures with smaller dimensions than those achieved using LOCOS insulation.

In one embodiment, the invention provides a process for producing an insulation structure in a semiconductor substrate. The process includes providing the semiconductor substrate, producing and patterning an implantation mask on a surface of the semiconductor substrate, implanting elements into at least one subregion of the semiconductor substrate, the implanted elements being selected in such a manner that on thermal activation they form an insulation region together with the further elements of the semiconductor substrate, and forming the insulation structure in the at least one subregion by irradiating the semiconductor substrate with laser radiation, in such a manner that at least the at least one subregion is melted and then recrystallizes.

The irradiation with laser radiation carried out is also referred to as laser annealing in the melt mode and differs from the known laser annealing in the non-melt mode by virtue of the fact that in this case the laser radiation which is absorbed in the semiconductor substrate causes the corresponding subregions to melt. Although dopant activation and diffusion processes which are customary both in laser annealing in the melt mode and in laser annealing in the non-melt mode or in RTP (rapid thermal processing) are carried out, they take place within in relative terms considerably shorter time scales and at higher temperatures compared to the processes mentioned or also lamp annealing (flash lamp anneal).

During laser annealing in the melt mode, the semiconductor substrate is melted for a few nanoseconds close to the surface, i.e., typically in the range from a few nanometers to a few hundred nanometers. Elements which have previously been implanted in the at least one subregion are dissolved in the melt and, as described above, form the insulation region together with the further elements of the semiconductor substrate as a result of the thermal activation caused by melting. On account of the time scales in the range of nanoseconds which are typical of this process, diffusion of the implanted elements and therefore an increase in the size of the structures are negligible. Consequently, steeper flanks in the transition region from the insulation structure to the surface of the semiconductor substrate can be achieved compared to the dimensions of a LOCOS bird's beak.

In addition to its electrical insulation properties, the insulation structure also has optical and thermal properties which differ from those of the semiconductor substrate and with the aid of which advantageous optical and thermal structures, such as gratings, waveguides, heat conductors, can be formed.

The semiconductor substrate may, for example, consist of silicon, a III-V-semiconductor or a III-V-semiconductor compound system, such as for example gallium arsenide, or alternatively of further semiconductor compounds, such as SiGe or SiC.

In one embodiment, the implantation mask is formed as resist and is removed again following the implantation.

In one embodiment, the patterned implantation mask has topology stages which form openings and the structural composition of which is maintained in further processes. Therefore, the implantation mask may, for example, consist of a layer stack made up of an insulation structure, such as for example $SiO_2$, and a polysilicon layer, which remain in place during the subsequent processing of the semiconductor substrate at least in the region of the topology stages and form component parts of a semiconductor structure that is to be formed.

In one embodiment, oxygen or nitrogen or oxygen and nitrogen are selected as element to be implanted, and silicon is selected as semiconductor substrate, in order for the insulation structure to be formed from silicon oxide or silicon nitride or oxynitride. Silicon oxide or silicon nitride are suitable as insulation structure for silicon. These can be used on the one hand for electrical insulation, but on account of their thermal conductivity being worse than that of silicon can also be used to divert a flow of heat in the semiconductor substrate. However, the elements to be implanted are in no way restricted to silicon and nitrogen, but rather further elements may also be suitable for this purpose, in particular if they form insulating compounds with the elements of the semiconductor substrate selected in each instance. In another embodiment, the distance between adjacent subregions is selected to be less than 500 nm. This involves corresponding patterning of the implantation mask. Using such short distances, it is possible in particular to achieve higher integration densities than with LOCOS insulation, since process-induced lateral widening of the structures as explained above is negligible.

One embodiment provides the elements to be implanted according to an implantation profile extending as far as the surface of the semiconductor substrate. This can achieved, for example taking into account the interaction of the elements to be implanted with the semiconductor substrate, inter alia by selecting suitable values for implantation energy and implantation dose. An insulation structure produced according to this embodiment extends as far as the surface of the semiconductor substrate.

One embodiment provides for implantation energies of less than 100 keV and implantation doses of greater than $10^{15}$ $cm^{-2}$ to be selected in order to form the implantation profile extending as far as the surface. The implantation energy and implantation dose can be defined more accurately taking account of the target profile that is to be set and also the interaction between the semiconductor substrate and the element that is to be implanted. In particular, what is known as oxygen shower is suitable for introducing oxygen into the semiconductor substrate, since this process can be used to introduce high concentrations of oxygen up to the range of $10^{22}$ cm$^{-3}$ into the semiconductor substrate with moderate energies in the range from 10-50 keV.

As an alternative or in addition to the implantation of an implantation profile which extends as far as the surface of the semiconductor substrate, the elements that are to be implanted are implanted according to an implantation profile which is buried in the semiconductor substrate.

An implantation energy of greater than 100 keV and an implantation dose of greater than $10^{15}$ cm$^{-2}$ are selected for this purpose. The implantation parameters can be defined in more detail taking into account the desired target profile and also the interaction between the semiconductor substrate and the elements that are to be implanted.

In a further embodiment, one type or various types of elements are implanted down to different depths of the semiconductor substrate over a plurality of implantation steps in order to form the implantation structure, the plurality of implantation steps being based on a common implantation mask or in each case different implantation masks or partially common implantation masks.

Insulation regions can be produced at different depths in the semiconductor substrate. The insulation regions formed at different depths can, for example, be used to carry current, light or heat and define corresponding paths. In this embodiment, the profile of an interface between the insulation regions and the semiconductor substrate is used to define desired current, light or heat paths.

One embodiment of an insulation structure, which is formed by means of a profile of implanted elements extending as far as the surface of the semiconductor substrate, has at least one insulation region formed at the surface of the semiconductor substrate, the at least one insulation region, relative to the surface of a directly adjacent region of the semiconductor substrate, both extending into and projecting out of the semiconductor substrate; and a flank of the at least one insulation region having a lateral extent of less than 50 nm from the surface of the directly adjacent region to a top side or an underside of the insulation region.

The projection relative to the surface of a semiconductor substrate region that is not covered by an insulation region, as in the case of a LOCOS structure, is attributable to an increase in volume during the formation of the insulation regions caused by the formation of a chemical compound between the implanted elements and the semiconductor substrate, e.g. between silicon as semiconductor substrate and oxygen as implanted element to form $SiO_2$. The process times of laser annealing in the melt mode, which in the range of a few ns are considerably shorter than for the conventional LOCOS process, on account of the negligible outdiffusion of the implanted elements, allow steep flanks to be formed in the edge region of the insulation region with respect to the semiconductor substrate. This allows a considerable reduction in the lateral dimensions which occur at the bird's beak with a LOCOS structure.

A further embodiment of an insulation structure, the production of which involves the implantation of elements into the semiconductor substrate with a buried profile, is provided by a plurality of buried insulation regions which are spaced apart from one another and are embedded within the semiconductor substrate. An embedded, buried insulation region is distinguished by the fact that it adjoins the semiconductor substrate over its entire surface and, moreover, has a uniform material composition within the insulation region, irrespective of a possibly amorphous crystal structure. Therefore, the insulation region differs for example from an insulation region which has been constructed from materials of different structure, such as for example a thermal oxide and a CVD oxide.

One embodiment provides for the buried insulation regions to be formed in the semiconductor substrate within a depth of from 100 to 300 nm below the surface. Melting of the semiconductor substrate by laser irradiation can advantageously be achieved down to this depth range. However, melting depths which differ from the range indicated above can also be achieved by selecting suitable laser sources and focusing conditions. In particular the wavelength of the laser radiation is of huge importance when setting the melting depth, since the absorption properties of the semiconductor substrate generally change considerably as a function of this variable.

In one advantageous embodiment, the insulation regions of the insulation structure at least in some cases are at a lateral distance of less than 500 nm from one another. Insulation regions at such a short distance from one another can be used, for example, as insulation regions in semiconductor ICs with a high packing density of components or as a structure for optical applications, e.g. as a grating or light conductor. Feature sizes in the range of several 100 nm are suitable in particular for interaction with light in the visible spectral region.

In a further embodiment, insulation regions at least in some cases have lateral dimensions of less than 500 nm parallel to the surface. It is in this way likewise possible to produce space-saving insulation regions, for example for the electrical insulation of adjacent well zones in semiconductor components or structures for optical applications, which are based on the different optical properties of semiconductor substrate and insulation region.

In a further embodiment of an insulation structure, to produce which the elements have been implanted according to a profile buried within the semiconductor substrate, there is a single insulation region buried at the same depth within the semiconductor substrate. This insulation region electrically separates a region of the semiconductor substrate located above it from a region of the semiconductor substrate located below it. An insulation structure arranged in this manner can be used, for example, to form SOI (silicon-on-insulator) substrates.

The insulation region or insulation regions advantageously has/have a thickness of less than 100 nm. Thicknesses of less than 50 nm are particularly advantageous. Such thin insulation regions are attributable to a negligible outdiffusion of the implanted elements on thermal activation by the laser irradiation, with the thickness substantially being determined by the implantation profile.

In a further insulation structure, to produce which the elements have been implanted according to a profile buried within the semiconductor substrate, the insulation regions are formed as parallel strips, the distance between the strips being in the range from 300 nm to 2 μm and/or the width of the strips being in the range from 300 nm to 2 μm. Insulation regions with these dimensions can be used to provide advantageous structures for optical applications, especially since the dimensions of the insulation regions of the insulation structure are in the wavelength region of visible light.

In one embodiment, the insulation structure has a plurality of buried insulation regions which are spaced apart from one another and are embedded within the semiconductor substrate, the surface of the semiconductor substrate being arched and being higher in those surface regions beneath which an insulation region has been formed than in the other surface regions. This type of arching of the surface of the semiconductor substrate is brought about by an increase in volume during the formation of the insulation regions, so that the semiconductor substrate is arched outwards at the surface in the region of the insulation regions. It is in this way possible, for example, to form current conduction channels with a delay function, in which the topology of the surface of the semiconductor substrate is incorporated. It is in this way also possible to form optical grating structures, with a path difference for light waves that are to be diffracted being produced by the topology at the surface.

In a further embodiment of an insulation structure produced in accordance with the invention, a plurality of insulation regions which are formed at different depths in the semiconductor substrate are provided. The insulation regions may differ both with regard to their material composition, i.e. for example $SiO_2$ or $Si_3N_4$, and with regard to their dimensions, such as length, width and depth. It is also possible for the insulation regions or part of the insulation regions to overlap.

FIG. 1 illustrates a diagrammatic cross-sectional view of a known LOCOS insulation structure 1. The LOCOS insulation structure 1 projects both into and out of a surface 2 of a semiconductor substrate 3 which is not covered by the LOCOS insulation structure 1. A characteristic bird's beak 4 is formed in the transition region between the LOCOS insulation structure 1 and the surface 2 of the semiconductor substrate 3. The formation of the bird's beak 4 originates from a nitride layer 5 in the region between adjacent LOCOS insulation structures 1, which prevents oxidation of the semiconductor substrate 3 at the surface 2 of the respective location during an oxidation process used to form the LOCOS insulation structure 1. For a thickness of the LOCOS insulation structure 1 of, for example, 600 nm, the dimensions of 3.6 µm for a fin and of 1.2 µm for a distance between LOCOS root points, as indicated in FIG. 1, result. The dimensions of the bird's beak 4 have to be taken into account in the design rules which serve to ensure process reliability and manufacturing suitability when using LOCOS insulation structures 1 and therefore limit the extent to which the size of this type of insulation structure can be reduced.

FIG. 2a illustrates a diagrammatic cross-sectional view of a process stage involved in the production of a semiconductor having an insulation structure in accordance with one embodiment of the invention. An implantation mask 6, e.g. a photoresist, has been applied to the surface 2 of a semiconductor substrate 3 and patterned. With the aid of the photomask 6, elements are implanted into subregions 7 at the surface 2 of the semiconductor substrate 3.

FIG. 2b illustrates a diagrammatic cross-sectional view of a subsequent process stage used to form the insulation structure 9. The implantation mask 6 in FIG. 2a is removed, and then a laser irradiation is carried out. During this process, the semiconductor substrate 3 is irradiated via the surface 2 using a laser, in such a manner that a layer of the semiconductor substrate 3 close to the surface, in which the subregions 7 have been formed, is melted and then recrystallizes during the subsequent cooling. Typical melting depths are in the range of a few 100 nm. During this melting and recrystallization process, the implanted elements in the subregions 7 combine with the further elements of the semiconductor substrate 3 to form insulation regions 8 of the insulation structure 9.

For the sake of clarity, the figures deal only with the processes and regions which are important to gaining an understanding of the invention. Furthermore, for the sake of clarity the figures are not necessarily illustrated to scale. Well zones which have already been formed in the semiconductor substrate 3 or well zones which are to be formed in a subsequent process or further insulation or wiring regions are not illustrated if they are not required in order to gain an understanding of the invention.

The insulation regions 8 illustrated in FIG. 2b can be used, for example, as insulation regions between adjacent semiconductor wells and electrically insulate semiconductor components formed therein from one another.

If oxygen is implanted into the subregions 7 of a semiconductor substrate 3 consisting of silicon, the laser irradiation in the form of the laser annealing in the melt mode leads to the thermally activated formation of $SiO_2$ in the insulation regions 8. An increase in volume in the region of the insulation regions 8 resulting from the formation of $SiO_2$ can be recognized from the fact that the insulation regions 8 cause a curvature at the surface 2 of the semiconductor substrate 3. A region corresponding to the bird's beak 4 of the LOCOS insulation structure shown in FIG. 1 is illustrated as transition region 10 in FIG. 2b. Lateral extents from a root point of an insulation region 8 adjacent to the surface 2 to a top side or underside are in the range from 1 to a few tens of nanometers, on account of the duration of the melting operations being in the range of a few nanoseconds. Diffusion of the implanted dopants during the laser annealing is negligible on account of the short time scales of this process.

FIG. 3a diagrammatically depicts a process stage at the start of the production of an insulation structure in accordance with a further embodiment of the invention. In alternative to the embodiment illustrated in FIG. 2a, the elements in FIG. 3a are implanted via the implantation mask 6 into subregions 7' which are embedded in the semiconductor substrate 3, i.e. are buried. Burying of the subregions 7' can be achieved, for example, by increasing the implantation energy compared to the subregions 7 positioned in FIG. 2a.

FIG. 3b, like FIG. 2b, illustrates the insulation structure 9 produced by laser irradiation following the laser annealing in the melt mode. It should be noted that the elements used to form the insulation regions 8' are implanted at most to a depth down to which the semiconductor substrate 3 can be melted. On account of the increase in volume produced during the formation of the insulation regions 8' during the laser annealing, e.g. oxidation of silicon and implanted oxygen atoms to form $SiO_2$, the surface 2 of the semiconductor substrate 3 is arched outwards at the locations beneath which insulation regions 8' are formed. The insulation structure 9 illustrated in FIG. 3b can be assigned a large number of functions, for example for forming current conduction channels, heat-carrying channels or optical guide regions. Therefore, in addition to the electrical insulation properties, it is also possible to make use of properties relating to a difference in thermal conductivity with respect to the surrounding semiconductor substrate 3 or a difference in refractive index with respect to the surrounding semiconductor substrate 3.

FIGS. 4a and 4b diagrammatically depict cross-sectional views of semiconductor substrates 3 with current conduction channels in semiconductor zones 12, 12'. The current conduction channels are formed between contact terminals 11 and 11' along the semiconductor zones 12, 12' formed at the surface 2 of the semiconductor substrate 3 (a current path in the channel is indicated by way of example using arrows). The surface in the current channel shown in FIG. 4a is planar.

By contrast, the insulation regions 8' of the insulation structure 9 are buried beneath the further current channel shown in FIG. 4b (cf. also FIG. 3b). As has been explained in connection with FIG. 3b, this leads to arching of the surface 2 of the semiconductor substrate 3. If it is assumed that a lateral distance between the contact terminals 11, 11' is identical in FIG. 3a and FIG. 3b, the result in FIG. 4b, on account of the semiconductor zone 12' being routed along the curvatures at the surface 2, is the delayed current channel compared to FIG. 4a. The delay is attributable to the lengthening of the current channel brought about by the arching of the surface 2.

FIG. 5a illustrates a diagrammatic cross-sectional view of a further exemplary embodiment of an insulation structure 9 produced in accordance with the invention. The insulation structure 9 has insulation regions 8, 8' which, together with the surface 2 of the semiconductor substrate 3, define a delimited region 13 of the semiconductor substrate 2. This delimited region 13 can be used, for example, as an optical waveguide. In this case, in particular insulation regions 8, 8' with a refractive index lower than that of the semiconductor substrate 3 are suitable, for example $SiO_2$ as insulation region 8, 8' and silicon as semiconductor substrate 3 or delimited region 13.

FIG. 5b illustrates diagrammatic curves representing a refractive index n on section lines AA' and BB' from FIG. 5a. The individual sections of the curves are provided with the reference designations used to denote the respective regions in FIG. 5b. A sudden change in refractive index from the insulation regions 8 to the delimited region 13 can be recognized along section line AA'; this change is attributable, for example, to the difference in refractive index between Si (delimited region 13) and $SiO_2$ (insulation region 8). Therefore, wave guidance can be achieved within the delimited region 13. Similar properties are found on observing the curve of the refractive index n along section line BB'. In this case, the sudden change in refractive index at the delimited region 13 is brought about both by a transition between a region located above the surface 2, which is not specified in more detail, and the delimited region 13 and also between the buried insulation region 8' and the delimited region 13. If the material which is formed on the surface 2 of the semiconductor substrate 3 and is not specified in more detail (e.g. $SiO_2$) is selected appropriately, it is in this case too possible to achieve advantageous wave guidance.

FIG. 6 illustrates a diagrammatic cross-sectional view of a further exemplary embodiment of an insulation structure 9 produced in accordance with the invention. The insulation structure 9 has strip-like insulation regions 8 running parallel to one another. The insulation regions 8 have a different refractive index from the semiconductor substrate 3, and the distance d between adjacent insulation regions is in the region of the wavelength of visible light, i.e. 400 nm-800 nm. Therefore, the insulation structure 9 diffracts incident light, so that it acts, for example, as an optical grating structure.

Figure 7:
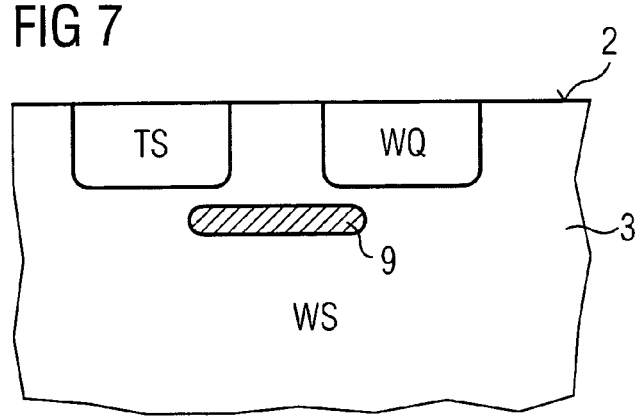
FIG. 7 illustrates a diagrammatic cross-sectional view of a semiconductor substrate with an insulation structure for guiding the heat flow in accordance with a further embodiment of the invention.

FIG. 7 illustrates a diagrammatic cross-sectional view of a semiconductor substrate 3, with an insulation structure 9 produced in accordance with the invention embedded in its interior. The insulation structure 9 is located in a region beneath and between a heat source WQ, which may be formed for example by a power transistor, and a temperature sensor TS, which is likewise realized by a semiconductor component. The semiconductor substrate 3 itself constitutes a heat sink WS.

In the case of silicon as semiconductor substrate 3 and $SiO_2$ as insulation structure 9, the insulation structure 9 has a considerably worse thermal conductivity than the semiconductor substrate 3. To achieve a temperature measurement which is as accurate as possible in the region of the heat source WQ despite the regions for arranging temperature sensor TS and heat source WQ being locally separate from one another, it may be of benefit for some of the heat dissipated from the heat source WQ to the heat sink WS to be diverted towards the temperature sensor TS. This function is performed by the insulation structure 9, the dimensions and arrangement of which can advantageously be defined by electro-thermal simulations, in order for the temperature sensor TS to record a temperature of the heat source WQ which is as far as possible free of distortion.

Figure 8:
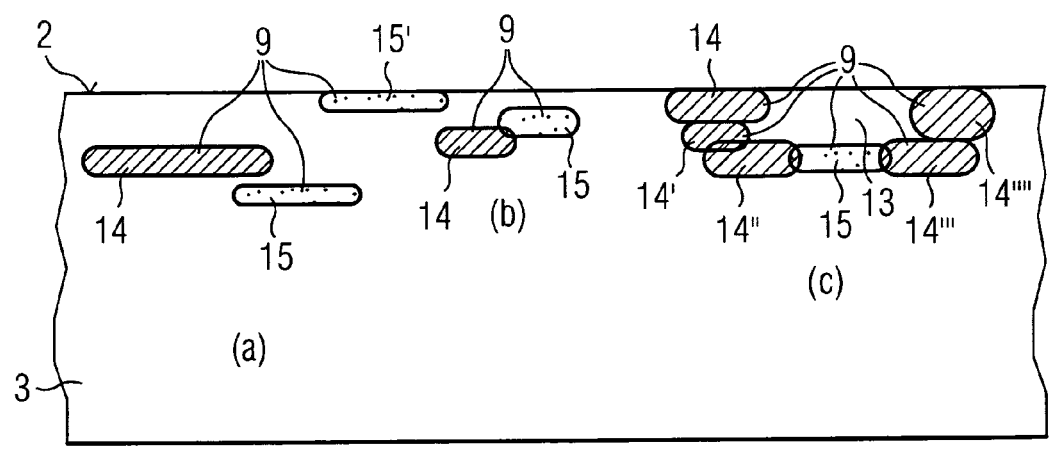
FIG. 8 illustrates a diagrammatic cross-sectional view of a semiconductor substrate with an insulation structure in accordance with a further embodiment of the invention.

FIG. 8 illustrates a diagrammatic cross-sectional view of a semiconductor substrate 3, in the interior of which insulation structures 9 produced in accordance with the invention have been formed in subregions (a), (b) and (c). In subregion (a), the insulation regions 14 are formed from silicon oxide, and the insulation regions 15 and 15' are formed from silicon nitride, at different depths, and these insulation regions are vertically offset but partially overlap one another laterally. Likewise, in subregion (b), the insulation region 14 is formed from silicon oxide and the insulation region 15 is formed from silicon nitride and these insulation regions overlap one another both laterally and vertically. In subregion (c), insulation regions 14, 14', 14", 14''', 14'''' have been formed from silicon oxide, partially overlap one another and are laterally linked to one another by an insulation region 15 made from silicon nitride. The insulation structure in subregion (c) defines a delimited region 13 of the semiconductor substrate 3.

Embodiments of the invention can also be combined in such a manner that a combination of the electrical, optical and thermal properties of the insulation structure is utilized, for example, in optoelectronics components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A process for producing a semiconductor having an insulation structure comprising:
    providing a semiconductor substrate;
    producing and patterning an implantation mask on a surface of the semiconductor substrate;
    implanting an element or elements into at least one subregion of the semiconductor substrate, the implanted element or elements being selected in such a manner that on thermal activation they form an insulation region together with further elements of the semiconductor substrate;
    irradiating the semiconductor substrate with laser radiation and performing laser annealing in the melt mode so that the semiconductor substrate with the at least one subregion is melted within a depth from 100 to 300 nm below the surface of the semiconductor substrate;
    recrystallizing as the insulation region the at least one subregion to form the insulation structure;
    wherein the elements are implanted according to an implantation profile extending as far as the surface of the semiconductor substrate.

2. The process according to claim 1, comprising:
    forming the implantation mask as resist, and
    removing the implantation mask following the implantation.

3. The process according to claim 1, comprising wherein the patterned implantation mask has topology stages which form openings and the structural composition of which is maintained in further processes.

4. The process according to claim 1, comprising:
  selecting oxygen or nitrogen or oxygen and nitrogen as implanted element, and selecting silicon as the semiconductor substrate, in order for the insulation structure to be formed from silicon oxide or silicon nitride or oxynitride; and
  wherein the distance between adjacent subregions is selected to be less than 500 nm.

5. The process according to claim 1, comprising selecting an implantation energy of less than 100 keV and an implantation dose of greater than $10^{15}$ cm$^{-2}$.

6. The process according to claim 1, comprising wherein one type or various types of elements are implanted down to different depths of the semiconductor substrate over a plurality of implantation processes in order to form the implantation structure, the plurality of implantation process being based on a common implantation mask or in each case different implantation masks or partially common implantation masks.

7. A process for producing an insulation structure in a semiconductor substrate, comprising:
  providing the semiconductor substrate;
  producing and patterning an implantation mask on a surface of the semiconductor substrate;
  implanting an element or elements into at least one subregion of the semiconductor substrate, the implanted element or elements being selected in such a manner that on thermal activation they form an insulation region together with further elements of the semiconductor substrate;
  irradiating the semiconductor substrate with laser radiation and performing laser annealing in the melt mode so that the semiconductor substrate with the at least one subregion is melted within a depth from 100 to 300 nm below the surface of the semiconductor substrate;
  recrystallizing as the insulation region the at least one subregion to form the insulation structure; and
  wherein one type or various types of elements are implanted down to different depths of the semiconductor substrate over a plurality of implantation processes in order to form the implantation structure, the plurality of implantation process being based on a common implantation mask or in each case different implantation masks or partially common implantation masks.

8. The process according to claim 7, comprising:
  forming the implantation mask as resist; and
  removing the implantation mask following the implantation.

9. The process according to claim 7, comprising wherein the patterned implantation mask has topology stages which form openings and the structural composition of which is maintained in further processes.

10. The process according to claim 7, comprising: selecting oxygen or nitrogen or oxygen and nitrogen as implanted element, and selecting silicon as the semiconductor substrate, in order for the insulation structure to be formed from silicon oxide or silicon nitride or oxynitride.

11. The process according to claim 7, comprising wherein the distance between adjacent subregions is selected to be less than 500 nm.

12. The process according to claim 7, comprising wherein the elements are implanted according to an implantation profile extending as far as the surface of the semiconductor substrate.

13. The process according to claim 12, comprising selecting an implantation energy of less than 100 keV and an implantation dose of greater than $10^{15}$ cm$^{-2}$.

14. The process according to claim 7, comprising implanting the elements according to an implantation profile buried in the semiconductor substrate.

15. The process according to claim 14, selecting an implantation energy of greater than 100 keV and an implantation dose of greater than $10^{15}$ cm$^{-2}$.

16. A process for producing an insulation structure in a semiconductor substrate, comprising:
  providing the semiconductor substrate;
  producing and patterning an implantation mask on a surface of the semiconductor substrate;
  implanting an element or elements into at least one subregion of the semiconductor substrate, the implanted element or elements being selected in such a manner that on thermal activation they form an insulation region together with further elements of the semiconductor substrate;
  irradiating the semiconductor substrate with laser radiation and performing laser annealing in the melt mode so that the semiconductor substrate with the at least one subregion is melted within a depth from 100 to 300 nm below the surface of the semiconductor substrate;
  recrystallizing as the insulation region the at least one subregion to form the insulation structure; and
  implanting the elements according to an implantation profile buried in the semiconductor substrate.

* * * * *